(12) United States Patent
Zhang et al.

(10) Patent No.: US 11,653,470 B2
(45) Date of Patent: May 16, 2023

(54) TOOL-FREE SUPPORT MOUNTING STRUCTURE AND SERVER

(71) Applicant: INSPUR SUZHOU INTELLIGENT TECHNOLOGY CO., LTD., Jiangsu (CN)

(72) Inventors: Sheng Zhang, Jiangsu (CN); Zhanlin Niu, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 17/780,310

(22) PCT Filed: Jun. 28, 2020

(86) PCT No.: PCT/CN2020/098400
§ 371 (c)(1),
(2) Date: May 26, 2022

(87) PCT Pub. No.: WO2021/159652
PCT Pub. Date: Aug. 19, 2021

(65) Prior Publication Data
US 2022/0369492 A1    Nov. 17, 2022

(30) Foreign Application Priority Data
Feb. 14, 2020 (CN) .......................... 202010093664.2

(51) Int. Cl.
*H05K 7/14* (2006.01)
*H05K 5/02* (2006.01)

(52) U.S. Cl.
CPC .......... *H05K 7/1489* (2013.01); *H05K 5/023* (2013.01); *H05K 7/1487* (2013.01)

(58) Field of Classification Search
CPC ..... H05K 7/1489; H05K 5/023; H05K 7/1487
See application file for complete search history.

(56) References Cited

U.S. PATENT DOCUMENTS

| 6,826,045 B2 * | 11/2004 | Chen ........................ G06F 1/184 |
| 7,483,263 B2 * | 1/2009 | Chen ........................ G06F 1/181 |
| | | 361/679.02 |

(Continued)

FOREIGN PATENT DOCUMENTS

| CN | 2651809 Y | 10/2004 |
| CN | 2665790 Y | 12/2004 |

(Continued)

OTHER PUBLICATIONS

International Search Report of corresponding PCT application PCT/CN2020/098400, dated Nov. 18, 2020, 6 pages.

(Continued)

*Primary Examiner* — Kimberley S Wright
(74) *Attorney, Agent, or Firm* — Cooper Legal Group, LLC (57) ABSTRACT

A tool-free support mounting structure is provided, including a base, a handle, and a support. The handle and the support are slidably connected along a first direction; the support and the base are clamped through a limiting slot and a limiting bulge; a slot width direction of the limiting slot is consistent with the first direction, and a slot depth direction is a second direction perpendicular to the first direction; when the limiting bulge is embedded in the limiting slot, the handle and the base are clamped through a fixing slot taking a slot depth direction as the first direction, and a fixing bulge; and an opening used for guiding the fixing bulge to enter, along the second direction, is formed in a notch of the fixing slot.

18 Claims, 5 Drawing Sheets

(56) References Cited

U.S. PATENT DOCUMENTS

| | | | | |
|---|---|---|---|---|
| 7,542,271 | B2* | 6/2009 | Chen | G06F 1/187 |
| | | | | 248/221.11 |
| 8,434,726 | B2* | 5/2013 | Chen | G06F 1/187 |
| | | | | 248/220.21 |
| 9,625,957 | B1 | 4/2017 | Lai | |
| 11,081,144 | B1* | 8/2021 | Yang | G11B 33/124 |
| 2007/0236878 | A1* | 10/2007 | Lin | G06F 1/187 |
| | | | | 361/679.33 |
| 2011/0234068 | A1* | 9/2011 | Chang | G06F 1/181 |
| | | | | 312/309 |
| 2012/0305720 | A1* | 12/2012 | Chen | G06F 1/187 |
| | | | | 248/220.22 |
| 2019/0319351 | A1 | 10/2019 | Wu et al. | |
| 2021/0225410 | A1* | 7/2021 | Yang | G06F 1/187 |

FOREIGN PATENT DOCUMENTS

| | | |
|---|---|---|
| CN | 102053652 A | 5/2011 |
| CN | 102883577 A | 1/2013 |
| CN | 103853275 A | 6/2014 |
| CN | 104298320 A | 1/2015 |
| CN | 206162316 U | 5/2017 |
| CN | 106816763 A | 6/2017 |
| CN | 107092318 A | 8/2017 |
| CN | 107783612 A | 3/2018 |
| CN | 208314685 U | 1/2019 |
| TW | 1643545 B | 12/2018 |
| WO | 2019062888 A1 | 4/2019 |

OTHER PUBLICATIONS

Written Opinion of International Searching Authority of corresponding PCT application PCT/CN2020/098400, dated Nov. 18, 2020, 8 pages.

First Office Action of corresponding CN priority application CN202010093664.2, dated Jan. 29, 2021, 14 pages.

* cited by examiner

TOOL-FREE SUPPORT MOUNTING STRUCTURE AND SERVER

The present application claims priority to Chinese Patent Application No. 202010093664.2, filed on Feb. 14, 2020 in China National Intellectual Property Administration and entitled "Tool-Free Support Mounting Structure and Server", which is hereby incorporated by reference in its entirety.

FIELD

The present application relates to the technical field of equipment, more specifically to a tool-free support mounting structure, and further relates to a server including the above tool-free support mounting structure.

BACKGROUND

As requirements for the performance of servers increase, internal structures of the server are becoming more and more complex, and it is better that the volume is smaller. Therefore, in order to improve the integration degree of the server and the assembly efficiency of a module support, each module is usually integrated in the server in a tool-free manner. However, in order to realize a modular design of a structure in a case, some handle structures need to be designed on each module to assist in assembly between modules. On the basis that a handle is required to occupy a space as small as possible, the handle is required to be assembled in a tool-free manner. Therefore, a tool-free support handle plays an important role in the assembly of each module.

With the development of various types of server products, a handle of a server is also diversified, so it is particularly important to select a suitable handle for the server. For a high-end server, due to its higher integration degree, a case is usually plugged between the modules in a modular form, and it is required that module supports are assembled without a tool.

To sum up, how to effectively solve the problem of inconvenient mounting of module supports of a server is an urgent problem to be solved by those skilled in the art at present.

SUMMARY

In view of this, a first objective of the present application is to provide a tool-free support mounting structure. The tool-free support mounting structure can effectively solve the problem of inconvenient mounting of module supports of a server. A second objective of the preset application is to provide a server including the above tool-free support mounting structure.

In order to achieve the foregoing objectives, the present application provides the following technical solutions.

A tool-free support mounting structure includes a base, a handle, and a support. The handle and the support are slidably connected along a first direction; the support and the base are clamped through a limiting slot and a limiting bulge; a slot width direction of the limiting slot is consistent with the first direction, and a slot depth direction is a second direction perpendicular to the first direction; when the limiting bulge is embedded in the limiting slot, the handle and the base are clamped through a fixing slot taking a slot depth direction as the first direction, and a fixing bulge; and an opening used for guiding the fixing bulge to enter, along the second direction, is formed in a notch of the fixing slot.

In the tool-free support mounting structure, when the base is assembled into the support, the support moves relative to the base along a mounting direction in the second direction, such that the limiting bulge enters the limiting slot; at the same time, the opening is capable of guiding the fixing bulge to enter the notch of the fixing slot; the handle then moves relative to the support along the first direction, such that the fixing bulge is embedded in the fixing slot from the notch of the fixing slot to prevent the base from moving relative to the handle along the second direction. In the tool-free support mounting structure, the support and the base are fastened through the limiting slot and the limiting bulge to prevent the support and the base from relatively moving along the first direction; the support and the handle relatively slide along the first direction, so as to relatively fix the support and the handle in the second direction; and the handle and the base are relatively fixed through the fixing slot and the fixing bulge in the second direction, such that the support and the base are relatively fixed in the second direction. Furthermore, by the above analysis, it can be found that the tool-free support mounting structure is convenient to assemble, disassemble and operate, and no tool is used. By virtue of the structural characteristic of the handle, a force application operation is extremely easy. To sum up, when the tool-free support mounting structure is applied to a server, the tool-free support mounting structure can effectively solve the problem that a module support of the server is inconvenient to mount.

Preferably, the handle is provided with a sliding hole; the support is detachably fixed with a sliding block which is slidably fit with the sliding hole along the first direction; and one side of the sliding block away from the support has a limiting shoulder to prevent the handle from moving along a hole depth direction of the sliding hole towards a direction away from the support.

Preferably, the support is provided with the limiting slot, and the handle is provided with the fixing slot; and an orientation of a notch of the limiting slot is consistent with that of the opening.

Preferably, a resistance part is further included, which is used for applying a resistance when the fixing bulge embedded in the fixing slot is separated from the fixing slot.

Preferably, a resistance member is fixed on the handle; the resistance member is provided with a resistance hole; and the support is provided with the resistance part which is capable of being embedded in the resistance hole by virtue of a spherical surface.

Preferably, two resistance holes disposed side by side along the first direction are formed in the resistance member, so as to prevent the resistance part from moving respectively when the fixing bulge is embedded in the fixing slot and the fixing bulge is separated from the fixing slot.

Preferably, the handle and the base are clamped through two groups of the fixing slots and fixing bulges which are disposed side by side along the first direction and are respectively located on either side of the resistance member; the support and the base are clamped through two groups of the limiting slots and limiting bulges which are disposed side by side along the first direction and are respectively located on the either side of the resistance member; and the handle and the support are slidably connected through two groups of the sliding holes and sliding blocks which are disposed side by side along the first direction and are respectively located on the either side of the resistance member.

Preferably, a rivet nut is riveted and fixed on the support; the sliding block is in the form of a grub screw which is in threaded connection with the rivet nut; the limiting bulge is in the form of a limiting T-shaped nail fixed on the base; and the fixing bulge is in the form of a fixing T-shaped nail fixed on the base.

Preferably, the base includes two base sidewall parts disposed side by side along a third direction; the third direction is perpendicular to both the first direction and the second direction; the support includes two support sidewall parts disposed side by side along the third direction; in the third direction, handles are provided on either side; the handles on the either side, the support sidewall parts, and the base sidewall parts are disposed in sequence from inside to outside; the support sidewall parts are connected to the handles and the base sidewall parts; and the support sidewall parts and the base sidewall parts are connected.

Preferably, a cross section of the base perpendicular to the first direction is U-shaped; a cross section of the support perpendicular to the first direction is inverse U-shaped; and either side of the support is provided with avoiding slots into which one end of the handle close to the base penetrates.

In order to achieve the second objective, the present application further provides a server. The server includes any one of the above tool-free support mounting structures, and further includes a case and a module. The base of the tool-free support mounting structure is mounted in the case, and the module is mounted on the support of the tool-free support mounting structure. The tool-free support mounting structure has the above technical effects, such that the server with the tool-free support mounting structure should also have the corresponding technical effects.

BRIEF DESCRIPTION OF THE DRAWINGS

In order to describe the embodiments of the present application or the technical solutions in the prior art more clearly, drawings required to be used in the embodiments or the illustration of the prior art will be briefly introduced below. Obviously, the drawings in the illustration below are only some embodiments of the present invention. A person ordinarily skilled in the art also can acquire other drawings according to the provided drawings without creative work.

Reference numerals in the drawings are as follows:

1: node base; 1-1: limiting T-shaped nail; 1-2: fixing T-shaped nail; 2: left handle; 2-1: first sliding stroke hole; 2-2: first fixing slot; 2-3: first blind rivet hole; 2-4: first fixing member avoiding hole; 2-5: first operation indicator; 2-6: first handle operation hole; 2-7: first opening; 3: support; 3-1: limiting slot; 3-2: rivet nut; 3-3: resistance part; 4: right handle; 4-1: second sliding stroke hole; 4-2: second fixing slot; 4-3: second blind rivet hole; 4-4: second fixing member avoiding hole; 4-5: second operation indicator; 4-6: second handle operation hole; 4-7: second opening; 5: resistance member; 5-1: resistance hole; and 6: grub screw.

DETAILED DESCRIPTION

An embodiment of the present application discloses a tool-free support mounting structure, so as to effectively solve the problem of inconvenient mounting of a module support of a server.

The technical solutions in the embodiments of the present application will be described clearly and completely below in combination with the accompanying drawings of the embodiments of the present application. Obviously, the described embodiments are only part of the embodiments of the present application, not all embodiments. Based on the embodiments in the present application, all other embodiments obtained by a person ordinarily skilled in the art without creative work shall fall within the protection scope of the present application.

Figure 1:
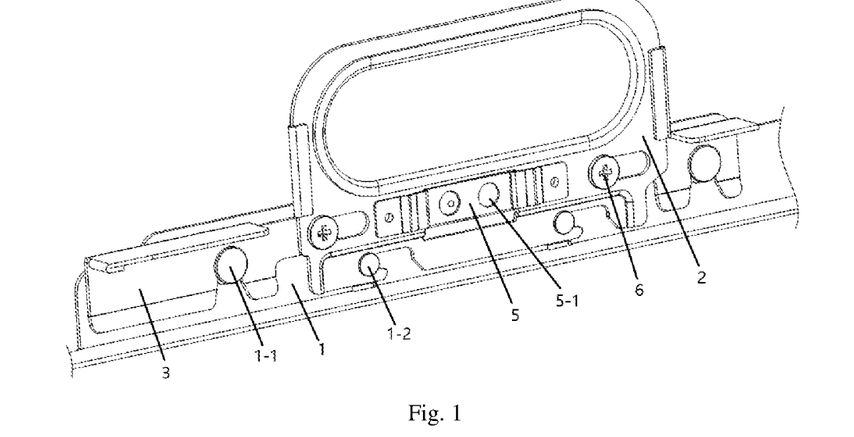
FIG. 1 is a sectional view showing that a right handle of a tool-free support mounting structure provided by the present application is locked.
Figure 2:
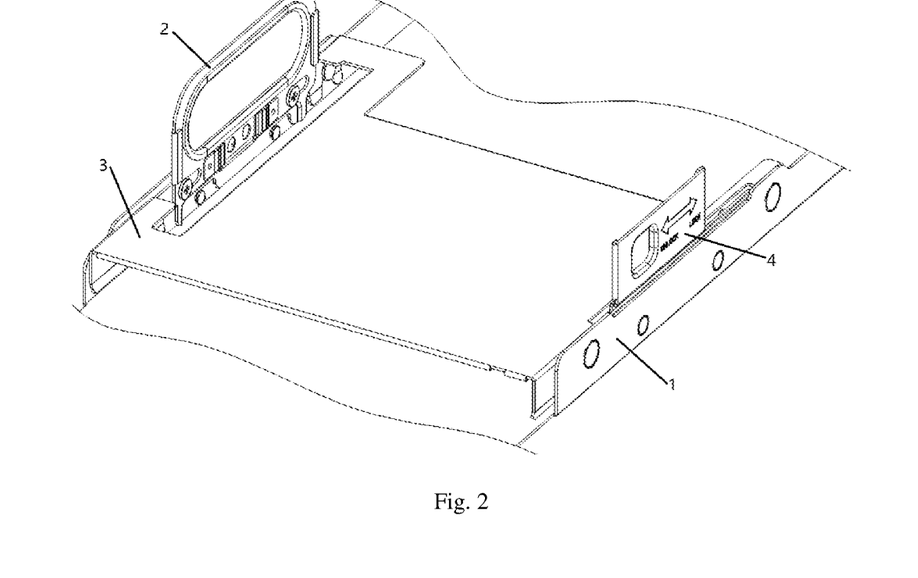
FIG. 2 is a schematic structural diagram of a right axis side of a three-dimensional structure of a tool-free support mounting structure provided by the present application.
Figure 3:
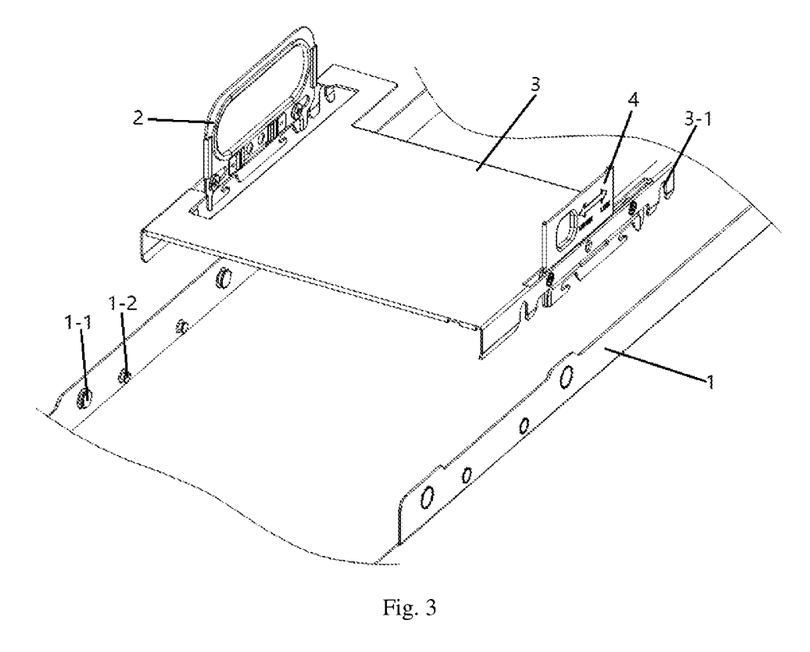
FIG. 3 is an exploded diagram of a support and a node base of a tool-free support mounting structure provided by the present application.
Figure 4:
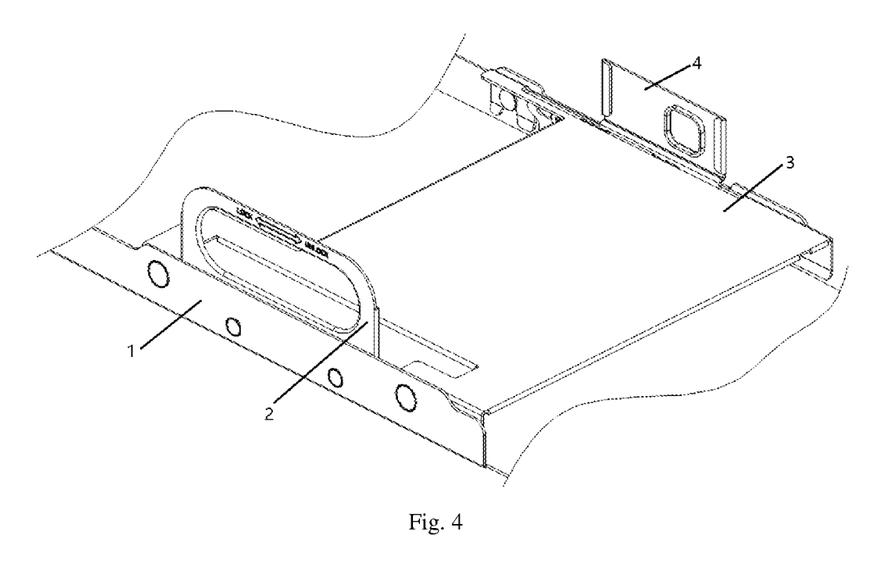
FIG. 4 is a schematic structural diagram of a left axis side of a three-dimensional structure of a tool-free support mounting structure provided by the present application.
Figure 5:
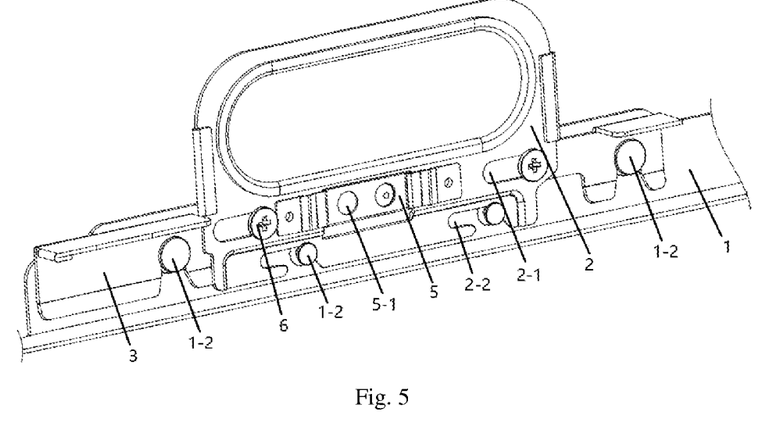
FIG. 5 is a sectional view showing that the right handle of the tool-free support mounting structure provided by the present application is unlocked.
Figure 6:
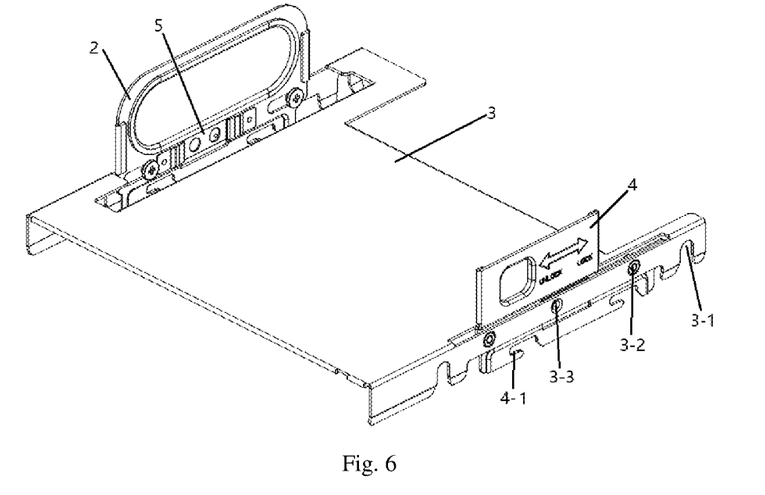
FIG. 6 is a schematic three-dimensional structural diagram of a support of a tool-free support mounting structure provided by the present application.
Figure 7:
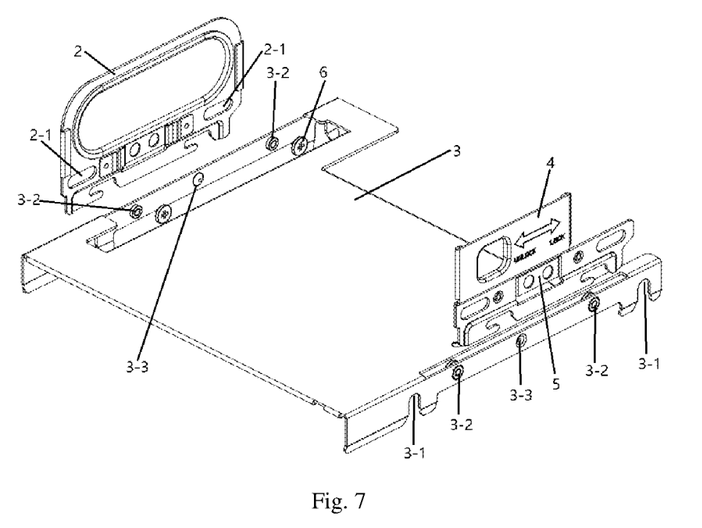
FIG. 7 is a schematic exploded diagram of a support of a tool-free support mounting structure provided by the present application.
Figure 8:
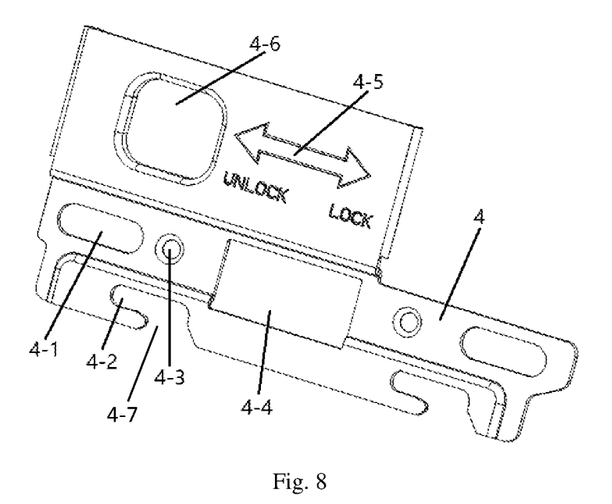
FIG. 8 is a schematic structural diagram of a right handle of a tool-free support mounting structure provided by the present application.
Figure 9:
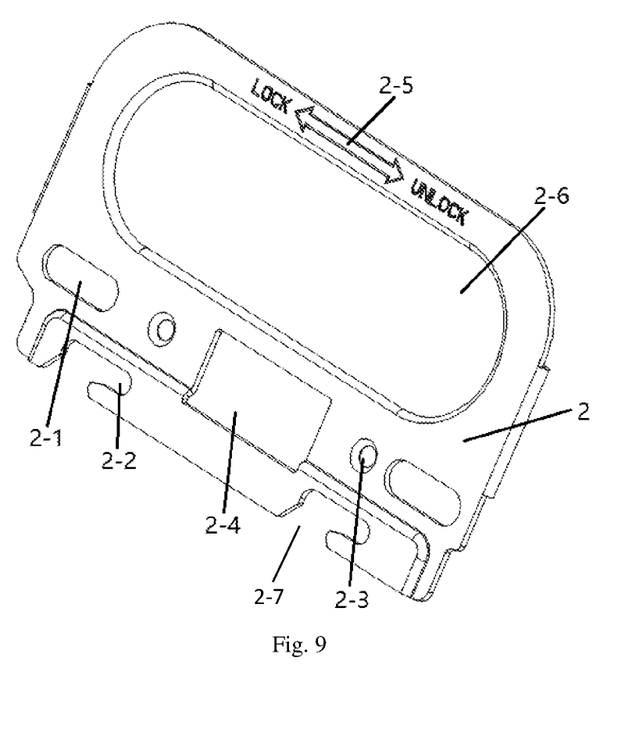
FIG. 9 is a schematic structural diagram of a left handle of a tool-free support mounting structure provided by the present application.

Referring to FIG. 1 to FIG. 9, FIG. 1 is a sectional view showing that a right handle of a tool-free support mounting structure provided by the present application is locked; FIG. 2 is a schematic structural diagram of a right axis side of a three-dimensional structure of a tool-free support mounting structure provided by the present application; FIG. 3 is an exploded diagram of a support and a node base of a tool-free support mounting structure provided by the present application; FIG. 4 is a schematic structural diagram of a left axis side of a three-dimensional structure of a tool-free support mounting structure provided by the present application; FIG. 5 is a sectional view showing that the right handle of the tool-free support mounting structure provided by the present application is unlocked; FIG. 6 is a schematic three-dimensional structural diagram of a support of a tool-free support mounting structure provided by the present application; FIG. 7 is a schematic exploded diagram of a support of a tool-free support mounting structure provided by the present application; FIG. 8 is a schematic structural diagram of a right handle of a tool-free support mounting structure provided by the present application; and FIG. 9 is a schematic structural diagram of a left handle of a tool-free support mounting structure provided by the present application.

In one specific embodiment, this embodiment provides a tool-free support mounting structure which is mainly applied to a server to achieve fast tool-free mounting of a module of a server. Specifically, the tool-free support mounting structure includes a base 1, a handle, and a support 3. In practical use, two handles are usually included: a left handle 2 and a right handle 4.

The base 1 may specifically be in the form of a node base, so as to mount and support a corresponding component. When applied to a server, the base 1 is connected to a case of the server, or they are integrally connected. The specific structure of the base 1 is usually set on demand. It may be a case structure, or may be a slot structure, or may be a plate structure.

The support 3 needs to be detachably and fixedly connected to the base 1, and is usually used for mounting various modules of the server. The support 3 mainly includes two structural parts. One structural part is a carrying structure used for carrying the module of the server, and its specific shape may correspond to the module to facilitate the mounting of the module. The other structural part is a connection portion used for realizing connection to the base 1 and other structures. Each handle (the left handle 2 and the right handle 4) has a force application part that people can hold or carry conveniently with a hand. The force application part is generally an operation hole. Of course, it may also be a shank part.

Each handle (the left handle 2 and the right handle 4) is slidably connected with the support 3 along the first direction, such that the handle and the support are prevented from relatively moving in a direction perpendicular to a first direction by the slidable connection. That is, the handle and the support 3 are maintained relatively fixed in the direction perpendicular to the first direction, so as to achieve limitation between them. The slidable connection is mainly achieved through a sliding hole and a sliding block, that is, one of the handle and the support 3 is provided with the sliding hole, and the other one is provided with the sliding block matching with the sliding hole. It should be noted that the first direction, the second direction and the third direction in the context not only include one orientation, but also include another orientation opposite to the orientation.

The support 3 and the base 1 are clamped through a limiting slot 3-1 taking a slot depth direction as the second direction, and a limiting bulge. That is, during mounting of the support 3 and the base 1, the limiting bulge is mainly embedded in the limiting slot 3-1 along the second direction, thus achieving clamping and fixing, such that the support 3 and the base 1 cannot move relative to the slot width direction of the limiting slot 3-1 by means of the clamping. The slot width direction of the limiting slot 3-1 is consistent with the first direction, such that the limiting bulge that is embedded is prevented, by means of the limiting slot 3-1, from moving along the first direction. The first direction is perpendicular to the second direction. One of the support 3 and the base 1 is provided with the limiting slot 3-1, and the other one is provided with the limiting bulge. For example, the support 3 is provided with the limiting slot 3-1, and the base 1 is correspondingly provided with the limiting bulge. It should be noted that the first direction and the second direction are mainly used to distinguish mounting orientations of various structures. In practical use, the first direction is usually a front-back direction, and the second direction is usually an up-down direction.

The handle and the base 1 are clamped through a fixing slot (a first fixing slot 2-2 and a second fixing slot 4-2) taking a slot depth direction as the first direction, and a fixing bulge. That is, the fixing bulge is embedded in the fixing slot along the first direction, such that when the handle slides relative to the support 3 along the first direction, the handle will slide relative to the base 1 along the first direction at the same time; at this time, the fixing bulge can slide into or slide out of the fixing slot;

and after the fixing bulge slides into the fixing slot, a slot wall of the fixing slot restrains the fixing bulge from moving along the second direction, so as to relatively fix the handle and the base 1 in the second direction.

An opening (a first opening 2-7 and a second opening 4-7) used for guiding the fixing bulge to enter a notch of the fixing slot is formed in the notch of the fixing slot. Generally, an orientation of the opening is consistent with a mounting direction of the support 3, such that when the support 3 is assembled to base 1, the support 3 moves relative to the base 1 along the mounting direction in the second direction, and then the limiting bulge enters the limiting slot 3-1. At the same time, the opening (the first opening 2-7 and the second opening 4-7) can guide the fixing bulge to enter the fixing slot (the first fixing slot 2-2 and the second fixing slot 4-2). The handle then moves relative to the support 3 along the first direction, that is, moves relative to the base 1 along the first direction, such that the fixing bulge is embedded in the fixing slot from the notch of the fixing slot, so as to prevent the base 1 from moving relative to the handle along the second direction and then to prevent the support 3 from moving relative to the base 1 along the second direction, that is, to prevent the limiting bulge from being separated from the limiting slot 3-1.

In the tool-free support mounting structure, the support 3 and the base 1 are fastened through the limiting slot and the limiting bulge to prevent the support and the base from relatively moving along the first direction; the support 3 and the handle relatively slide along the first direction, so as to relatively fix the support 3 and the handle in the second direction; and the handle and the base 1 are relatively fixed through the fixing slot and the fixing bulge in the second direction, such that the support 3 and the base 1 are relatively fixed in the second direction. Furthermore, by the above analysis, it can be found that the tool-free support mounting structure is convenient to assemble, disassemble and operate, and no tool is used. By virtue of the structural characteristic of the handle, a force application operation is extremely easy. To sum up, the tool-free support mounting structure can effectively solve the problem that the current tool-free support mounting structure is inconvenient to assemble and disassemble.

In actual operations, the tool-free support mounting structure needs to ensure the structural stability. Therefore, when the handle slides to embed the fixing bulge in the fixing slot, the fixing bulge is not easily separated from the fixing slot. Based on this, it is preferred that a resistance part is further included, which is used for applying a resistance when the fixing bulge embedded in the fixing slot is separated from the fixing slot, so as to effectively prevent the fixing bulge from being separated from the fixing slot to ensure the overall structural stability. Specifically, the resistance part may be an elastic necking part arranged at the notch of the fixing slot. When the fixing bulge is embedded, the elasticity increases, such that the fixing bulge can be embedded in the fixing slot. After the fixing bulge is embedded in the fixing slot, the resistance part is restored to the normal shape, that is, it shrinks to prevent the fixing bulge from being separated from the fixing slot.

Of course, other resistance parts may also be disposed alone, or of course, may be disposed together with the above elastic necking part. Specifically, a resistance member 5 may be fixed on the handle. The resistance member 5 is provided with a resistance hole 5-1. The support 3 is provided with the resistance part 3-3 which is capable of being embedded in the resistance hole 5-1 by virtue of a spherical surface. After the fixing bulge slides into the fixing slot along the first direction, the spherical resistance part 3-3 is embedded in the resistance hole 5-1 at this time. The resistance part 3-3 cannot be separated from the resistance hole 5-1 until there is a certain external force. The resistance hole 5-1 is generally a round hole.

As mentioned above, there are two main stop positions of the handle relative to the support 3. At one stop position, the fixing bulge is embedded in the fixing slot, and at the other stop position, the fixing bulge is separated from the fixing slot. In order to avoid the phenomenon that the handle randomly moves relative to the support 3 when the fixing bulge is separated from the fixing slot, it is preferred here that the resistance member 5 is provided with two resistance holes 5-1 disposed side by side along the first direction to prevent the resistance part 3-3 from moving respectively when the fixing bulge is embedded in the fixing slot and when the fixing bulge is separated from the fixing slot. Specifically, a distance between the two resistance holes 5-1 can be correspondingly set according to a slot depth of the fixing slot. It is preferred that the two resistance holes 5-1 are consistent in shape and size.

The handle is slidably connected with the support 3. The slidable connection is mainly achieved by a sliding rail and a sliding block. The sliding rail may be a slot structure or may be a hole mechanism. Specifically, it is preferred here that the handle is provided with a sliding hole. A cross section of the sliding hole extends in the first direction to be elongated. The support 3 is detachably fixed with a sliding block which is slidably fit with the sliding hole along the first direction. One side of the sliding block away from the support has a limiting shoulder to prevent the handle from moving along a hole depth direction of the sliding hole towards a direction away from the support 3, so as to effectively prevent the sliding block from being separated from the sliding hole. Specifically, the sliding block may be a screw fixed on the support 3. Specifically, a rivet nut 3-2 may be riveted and fixed on the support 3. The sliding block is a rod part of a grub screw 6 and is in threaded connection with the rivet nut 3-2. Therefore, the mounting between the handle and the support 3 is convenient. It should be noted that the handle and the support 3 are usually pre-assembled integrally. Since the handle and the support are not frequently assembled and disassembled, they can be mounted by a tool. It should be noted that the tool-free mounting in the present application mainly refers to assembling and disassembling between the support 3 and the base 1. The support and the base are frequently assembled and disassembled, such that tool-free mounting is of great significance.

As mentioned above, the support 3 and the base 1 are clamped and fixed through the limiting slot and the limiting bulge. For convenience of arrangement, the limiting slot may be formed in the support 3, and the fixing slot is formed in the handle. The orientation of the notch of the limiting slot is consistent with the orientation of the opening. In actual applications, the notch and the opening are both downward. Correspondingly, the base 1 is provided with the limiting bulge and the fixing bulge. Preferably, the limiting bulge is a limiting T-shaped nail 1-1 fixed on the base 1, and the fixing bulge is a fixing T-shaped nail 1-2 fixed on the base 1.

Further, considering that the limiting bulge, the fixing bulge, and the sliding block generally have cylindrical structures, for the stability of the entire structure, based on this, it is preferred here that the handle and the base 1 are clamped through two groups of the fixing slots and fixing bulges which are disposed side by side along the first direction, and the two groups of fixing slots and matching fixing bulges are respectively located on either side, in the first direction, of the resistance member 5. Correspondingly, the support 3 and the base 1 are clamped through two groups of the limiting slots and limiting bulges which are disposed side by side along the first direction, and the two groups of limiting slots and matching limiting bulges are respectively located on the either side, in the first direction, of the resistance member 5. The handle and the support 3 are slidably connected through two groups of the sliding holes and sliding blocks which are disposed side by side along the first direction, and the two groups of sliding holes and matching sliding blocks are respectively located on the either side, in the first direction, of the resistance member 5. Furthermore, preferably, either end part of the support 3 in the first direction are provided with limiting slots, and the handle is mounted in the middle of the support 3 in the first direction.

In actual operations, generally, left and right sides of the support 3 are provided with handles. Specifically, the base 1 includes two base sidewall parts disposed side by side along a third direction; and the third direction is perpendicular to both the first direction and the second direction. Furthermore, in actual applications, the third direction is a left-right direction. Correspondingly, the support 3 includes two support sidewall parts disposed side by side along the third direction. In the third direction, handles are provided on either side of the support 3. The handles on the either side, the support sidewall parts, and the base sidewall parts are disposed in sequence from inside to outside, and preferably, they lean against each other in sequence. The support sidewall parts are connected to the handles and the base sidewall parts as mentioned above, that is, the fixing bulges and the fixing slots are respectively provided; and the support sidewall parts and the base sidewall parts are connected, that is, the limiting bulges and the limiting slots are respectively provided. Preferably, the support sidewall parts may be provided with the sliding blocks, the resistance parts, and the limiting slots, and the base sidewall parts are provided with the fixing bulges and the limiting bulges.

Specifically, a cross section of the base 1 perpendicular to the first direction is U-shaped, and two side vertical plate parts are the base sidewall parts; a cross section of the support 3 perpendicular to the first direction is inverse U-shaped, and two side vertical plate parts are the support sidewall parts; and the two sides of the support 3 are provided with avoiding slots into which one end of the handle close to the base 1 penetrates, so as to facilitate the end of the handle close to the base 1 to penetrate into the avoiding slots and be connected to the handle; and the other end is provided with a handle force application part located on one side of the support 3 away from the base 1. When the second direction is an up-down direction, a handle connection side is translated to a lower side of a transverse plate part of the support 3 to achieve the above connection to the base 1 and the support 3, and the force application part of the handle is located on an upper side of the transverse plate part of the support 3 to facilitate force application by a hand.

In one specific embodiment, this embodiment provides a more optimized and specific tool-free support mounting structure, mainly including the following components.

The base 1 is a structure for carrying the support 3. It is overall like a shallow "U" shape that is composed of one bottom plate member and two base sidewall parts respectively located on either side of the bottom plate member, that is, a width of the bottom plate member is significantly greater than that of each base sidewall part. Two limiting T-shaped nails 1-1 are riveted on the two base sidewall parts of the base 1 and are used as the limiting bulges to limit left and right positions of the support 3. Two fixing T-shaped nails 1-2, i.e., the fixing bulges, are designed in middle positions of the two limiting T-shaped nails 1-1. After the support 3 is mounted in place, the first fixing slot 2-2 on the left handle 2 and the second fixing slot 4-2 on the right handle 4 are respectively assembled with the corresponding fixing T-shaped nails 1-2 to fix the upper and lower positions of the support 3.

The left handle 2 is mounted on the left side of the support 3. A handle operation indicator is designed at an upper part of the left handle 2. The indicator may be words including "LOCK" and "UNLOCK", indicating directions for locking and unlocking the handle. The handle is operated through a handle operation hole. The first handle operation hole 2-6 of the left handle 2 may be arranged below the first operation indicator 2-5. Two first sliding stroke holes 2-1 are designed at left and right positions below the first handle operation hole 2-6. After the left handle 2 is assembled on the support 3, a sliding stroke of the left handle 2 on the support 3 is controlled by the first sliding stroke holes 2-1. First blind rivet holes 2-3 are designed in positions of inner sides of the two first sliding stroke holes 2-1. The resistance member 5 is fixed to the support 3 and the handle through rivets. The left handle 2 and the right handle 4 are both limited and fixed through the resistance member 5 and the support 3. First fixing member avoiding holes 2-4 are designed in middle positions of the two first blind rivet holes 2-3. After the resistance member 5 is fixed to the inner side of the left handle 2, the fixing member avoiding holes 2-4 achieve avoidance for the resistance member 5 to enable the resistance member 5 to contact the base sidewall parts of the base 1. Two first fixing slots 2-2 are designed below the first sliding stroke holes 2-1. When the left handle 2 is locked, the first fixing slots 2-2 may be assembled with the fixing T-shaped nails 1-2 on the base 1 to fix the upper and lower positions of the support 3.

The right handle 4 is mounted on a right side of the support and cooperates with the left handle 2 to achieve locking and unlocking for the support 3. Second sliding stroke holes 4-1, second fixing slots 4-2, second blind rivet holes 4-3, and second fixing member avoiding holes 4-4 on the right handle 4 have the same structures and positions as those on the left handle 2, and the right handle is also correspondingly provided with a resistance member 5. A second operation indicator 4-5 is arranged on a rear side of an upper part of the right handle 4. The indicator may contain "LOCK", "UNLOCK", and other words, indicating locking and unlocking directions of the handle. The second operation indicator 4-5 is transversely disposed side by side, and a second handle operation hole 4-6 is designed thereon. The handle is operated through the handle operation hole.

The support 3 is a core component in the present application, which is overall like an inverted "U" shape and is composed of one support plate member and two support sidewall parts. On the two support sidewall parts, the following structures are designed in a mirrored manner two limiting slots 3-1 are designed at front and rear ends of the support sidewall parts; the limiting slots 3-1 may be assembled with the limiting T-shaped nails 1-1 on the base 1 to limit the front, rear, left, and right positions of the support 3; and two rivet nuts 3-2 are designed on the inner sides of the limiting slots 3-1. The rivet nuts 3-2 are assembled with the grub screws 6. The grub screws 6 on the left and right sides correspondingly pass through the first sliding stroke holes 2-1 and the second sliding stroke holes 4-1, respectively to assemble the left handle 2 and the right handle 4 to the support 3 and enable the support handles to slide along the formed sliding stroke holes. One resistance part 3-3 is designed in the middle of the two rivet nuts and can form an assembling relationship with the resistance holes 5-1 in the resistance member 5 to limit and fix the two support handles.

The two resistance members 5 are respectively riveted on the inner sides of the left handle 2 and the right handle 4 respectively through blind rivets, and the whole is elongated. Two resistance holes 5-1 are designed in the middle position of each resistance member 5. The two resistance holes 5-1 respectively correspond to locked and unlocked states of the left and right handles to fix the left and right handles.

There are a total of four grub screws 6 which cooperate with the rivet nuts 3-2 on the either side surface of the support 3. The left and right handles are assembled on the support 3.

During applications, first, the rivet nuts 3-2 are riveted on the two support sidewall parts of the support 3, and each side surface is riveted with two rivet nuts 3-2, next, the two resistance members 5 are respectively riveted and fixed on the left handle 2 through the first blind rivet holes 2-3 and on the right handle 4 through the second blind rivet holes 4-3, then the left handle 2 is assembled on the support 3, and the two first sliding stroke holes 2-1 on the left handle 2 are arranged on outer diameters of the two rivet nuts 3-2 on the support 3, and finally the grub screws 6 and the rivet nuts 3-2 are assembled together, so as to assemble the left handle on the support 3. The right handle 4 is assembled, according to the above same assembling way, on the other support sidewall surface of the support 3 to complete the assembling of the two support handles. The assembled support handles can slide forth and back along the sliding stroke holes, and handle fixing openings in the resistance members 5 are assembled with resistance parts 3-3 on the support 3.

When the assembled support 3 is assembled into the base 1, the left handle 2 and the right handle 4 are first placed at the UNLOCK positions; the support 3 is put into the base 1 from top to bottom; after the support 3 is assembled in place, the limiting slots 3-1 on the support 3 and the limiting T-shaped nails 1-1 on the base 1 are assembled to limit the left and right positions of the support 3; and at the same time, the first fixing slot 2-2 and the second fixing slot 4-2 on the left and right handles 4 initially contact (the fixing T-shaped nails 1-2), as shown in FIG. 5. Later, the first handle operation hole 2-6 and the second handle operation hole 4-6 are operated according to the first operation indicator 2-5 and the second operation indicator 4-5 on the support handles; the support handles slide in the sliding stroke holes towards LOCK until the first fixing slot 2-2 and the second fixing slot 4-2 on the support handles are assembled with the fixing T-shaped nails 1-2 on the base 1. Furthermore, the resistance holes 5-1 on the resistance members 5 and the resistance part 3-3 on the support 3 are assembled, as shown in FIG. 4. The locking step of the support is completed by the above steps.

When the support 3 needs to be unlocked, the first handle operation hole 2-6 and the second handle operation hole 4-6 on the left and right handles 2, 4 are operated towards UNLOCK according to the first operation indicator 2-5 and the second operation indicator 4-5; the left and right handles 2, 4 slide in the directions of the sliding stroke holes to the position shown in FIG. 5; and finally, the handle operation holes are operated to move the entire support 3 upward until the limiting slots 3-1 are separated from the limiting T-shaped nails on the base 1. The unlocking of the support 3 is completed by the above steps.

Based on the tool-free support mounting structure provided in the above embodiment, the present application further provides a server. The server includes any one of the tool-free support mounting structures in the above embodiment, and further includes a case and a module. The base of the tool-free support mounting structure is mounted in the case, and the module is mounted on the support of the tool-free support mounting structure. The server adopts the tool-free support mounting structure in the above embodiment, so a reference is made to the above embodiment for the beneficial effects of the server.

All the embodiments in the specification are described in a progressive manner. Contents mainly described in each embodiment are different from those described in other embodiments. Same or similar parts of all the embodiments refer to each other.

The foregoing description of the disclosed embodiments enables a person skilled in the art to implement or use the present application. Various modifications to these embodiments will be obvious to a person skilled in the art, and the general principles defined herein can be implemented in other embodiments without departing from the spirit or scope of the present invention. Therefore, the present invention will not be limited to these embodiments shown in this text, but should conform to the widest scope consistent with the principles and novel features disclosed herein.

The invention claimed is:

1. A tool-free support mounting structure, comprising a base, a handle, and a support, wherein the handle and the support are slidably connected along a first direction; the support and the base are clamped through a limiting slot and a limiting bulge; a slot width direction of the limiting slot is consistent with the first direction, and a slot depth direction is a second direction perpendicular to the first direction; when the limiting bulge is embedded in the limiting slot, the handle and the base are configured to be clamped through a fixing slot taking a slot depth direction as the first direction, and a fixing bulge; and an opening used for guiding the fixing bulge to enter, along the second direction, is formed in a notch of the fixing slot; and
    wherein the handle and the base are clamped through two groups of the fixing slots and the fixing bulges which are disposed side by side along the first direction and are respectively located on either side of a resistance member which is fixed on the handle; the support and the base are clamped through two groups of the limiting slots and the limiting bulges which are disposed side by side along the first direction and are respectively located on the either side of the resistance member; and the handle and the support are slidably connected through two groups of sliding holes and sliding blocks which are disposed side by side along the first direction and are respectively located on the either side of the resistance member.

2. The tool-free support mounting structure according to claim 1, wherein the handle is provided with the sliding holes; the support is detachably fixed with the sliding blocks which are slidably fit with the sliding hole along the first direction; and one side of the sliding blocks away from the support has a limiting shoulder to prevent the handle from moving along a hole depth direction of the sliding holes towards a direction away from the support.

3. The tool-free support mounting structure according to claim 2, wherein the support is provided with the limiting slots, and the handle is provided with the fixing slots; and an orientation of a notch of the limiting slots is aligned with that of the opening.

4. The tool-free support mounting structure according to claim 3, further comprising a resistance part, which is used for applying a resistance when the fixing bulge embedded in the fixing slot is separated from the fixing slot.

5. The tool-free support mounting structure according to claim 4, wherein the resistance member is provided with a resistance hole;
    and the support is provided with the resistance part which is configured to be embedded in the resistance hole by virtue of a spherical surface.

6. The tool-free support mounting structure according to claim 5, wherein two resistance holes disposed side by side along the first direction are formed in the resistance member, so as to prevent the resistance part from moving respectively when the fixing bulge is embedded in the fixing slot and the fixing bulge is separated from the fixing slot.

7. The tool-free support mounting structure according to claim 6, wherein a rivet nut is riveted and fixed on the support; the sliding block is in form of a grub screw which is in threaded connection with the rivet nut; the limiting bulge is in form of a limiting T-shaped nail fixed on the base; and the fixing bulge is in form of a fixing T-shaped nail fixed on the base.

8. The tool-free support mounting structure according to claim 7, wherein the base comprises two base sidewall parts disposed side by side along a third direction; the third direction is perpendicular to both the first direction and the second direction; the support comprises two support sidewall parts disposed side by side along the third direction; in the third direction, handles are provided on either side; the handles on the either side, the two support sidewall parts, and the two base sidewall parts are disposed in sequence from inside to outside; the two support sidewall parts are connected to the handles and the two base sidewall parts; and the two support sidewall parts and the two base sidewall parts are connected.

9. The tool-free support mounting structure according to claim 8, wherein a cross section of the base perpendicular to the first direction is U-shaped; a cross section of the support perpendicular to the first direction is inverse U-shaped; and either side of the support is provided with avoiding slots into which one end of the handle close to the base penetrates.

10. A server, comprising a case and a module, and further comprising a tool-free support mounting structure, wherein the tool-free support mounting structure comprises a base, a handle and a support, wherein the handle and the support are slidably connected along a first direction; the support and the base are clamped through a limiting slot and a limiting bulge; a slot width direction of the limiting slot is consistent with the first direction, and a slot depth direction is a second direction perpendicular to the first direction; when the limiting bulge is embedded in the limiting slot, the handle and the base are configured to be clamped through a fixing slot taking a slot depth direction as the first direction, and a fixing bulge; and an opening used for guiding the fixing bulge to enter, along the second direction, is formed in a notch of the fixing slot,
    wherein the handle and the base are clamped through two groups of the fixing slots and the fixing bulges which are disposed side by side along the first direction and are respectively located on either side of a resistance member which is fixed on the handle; the support and the base are clamped through two groups of the limiting slots and the limiting bulges which are disposed side by side along the first direction and are respectively located on the either side of the resistance member; and the handle and the support are slidably connected through two groups of sliding holes and sliding blocks which are disposed side by side along the first direction and are respectively located on the either side of the resistance member, and wherein the base of the tool-free support mounting structure is mounted on the case; and the module is mounted on the support of the tool-free support mounting structure.

11. The server according to claim 10, wherein the handle is provided with the sliding holes; the support is detachably fixed with the sliding blocks which are slidably fit with the sliding hole along the first direction; and one side of the sliding blocks away from the support has a limiting shoulder to prevent the handle from moving along a hole depth direction of the sliding holes towards a direction away from the support.

12. The server according to claim 11, wherein the support is provided with the limiting slots, and the handle is provided with the fixing slots; and an orientation of a notch of the limiting slots is aligned with that of the opening.

13. The server according to claim 12, wherein the tool-free support mounting structure further comprises a resistance part, which is used for applying a resistance when the fixing bulge embedded in the fixing slot is separated from the fixing slot.

14. The server according to claim 13, wherein the resistance member is provided with a resistance hole; and the support is provided with the resistance part which is configured to be embedded in the resistance hole by virtue of a spherical surface.

15. The server according to claim 14, wherein two resistance holes disposed side by side along the first direction are formed in the resistance member, so as to prevent the resistance part from moving respectively when the fixing bulge is embedded in the fixing slot and the fixing bulge is separated from the fixing slot.

16. The server according to claim 15, wherein a rivet nut is riveted and fixed on the support; the sliding block is in form of a grub screw which is in threaded connection with the rivet nut; the limiting bulge is in form of a limiting T-shaped nail fixed on the base; and the fixing bulge is in form of a fixing T-shaped nail fixed on the base.

17. The server according to claim 16, wherein the base comprises two base sidewall parts disposed side by side along a third direction; the third direction is perpendicular to both the first direction and the second direction; the support comprises two support sidewall parts disposed side by side along the third direction; in the third direction, handles are provided on either side; the handles on the either side, the two support sidewall parts, and the two base sidewall parts are disposed in sequence from inside to outside; the two support sidewall parts are connected to the handles and the two base sidewall parts; and the two support sidewall parts and the two base sidewall parts are connected.

18. The server according to claim 17, wherein a cross section of the base perpendicular to the first direction is U-shaped; a cross section of the support perpendicular to the first direction is inverse U-shaped; and either side of the support is provided with avoiding slots into which one end of the handle close to the base penetrates.

* * * * *